United States Patent
Lam et al.

(10) Patent No.: US 10,128,325 B2
(45) Date of Patent: Nov. 13, 2018

(54) INDUCTOR STRUCTURES FOR INTEGRATED CIRCUITS

(71) Applicant: WaferTech, LLC, Camas, WA (US)

(72) Inventors: Kin Fung (Wayne) Lam, Vancouver, WA (US); Hsin-I Li, Camas, WA (US); Wen-Bin Tsai, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 14/666,107

(22) Filed: Mar. 23, 2015

(65) Prior Publication Data
US 2015/0279921 A1    Oct. 1, 2015

Related U.S. Application Data

(60) Provisional application No. 61/970,797, filed on Mar. 26, 2014.

(51) Int. Cl.
*H01L 23/52* (2006.01)
*H01L 49/02* (2006.01)
*H01L 23/522* (2006.01)

(52) U.S. Cl.
CPC .......... *H01L 28/10* (2013.01); *H01L 23/5227* (2013.01); *H01L 2924/0002* (2013.01)

(58) Field of Classification Search
CPC ..... H01L 28/10; H01L 23/5227; H01F 27/28; H01F 30/04
USPC ...................................................... 257/531
See application file for complete search history.

(56) References Cited

U.S. PATENT DOCUMENTS

| | | | | |
|---|---|---|---|---|
| 3,290,758 A * | 12/1966 | Moyer | .................. | H01F 41/046 257/108 |
| 5,336,921 A * | 8/1994 | Sundaram | ............... | H01L 27/08 257/531 |
| 6,031,445 A * | 2/2000 | Marty | ..................... | H01L 28/10 336/200 |
| 6,236,538 B1 * | 5/2001 | Yamada | .............. | H01F 17/0033 360/123.6 |
| 6,586,309 B1 * | 7/2003 | Yeo | ...................... | H01L 23/5227 257/531 |
| 6,614,093 B2 * | 9/2003 | Ott | .......................... | H01L 28/10 336/200 |
| 6,833,781 B1 * | 12/2004 | Padmanabhan | ..... | H01F 17/0033 257/537 |
| 7,081,803 B2 * | 7/2006 | Takaya | ................ | H01F 17/0033 336/200 |

(Continued)

*Primary Examiner* — Elvin G Enad
*Assistant Examiner* — Malcolm Barnes
(74) *Attorney, Agent, or Firm* — Duane Morris LLP

(57) ABSTRACT

Multiple intertwined inductor coils combine to form one or more transformer devices of a semiconductor device. The intertwined inductor coils are formed of only two metallization layers and vias coupling the layers. The inductor coils are vertically oriented and include a magnetic axis parallel to the substrate surface. A plurality of metal wires are provided on both a first device level and a second device level. Each of the metal wires on the first device level is coupled to two wires on the second device level and forms a first inductor coil. The two metal wires on the second device level that form part of the first inductor coil, are separated by a third wire that is coupled to two different first device level metal wires and forms part of a different second inductor coil intertwined with the first inductor coil.

19 Claims, 3 Drawing Sheets

(56) References Cited

U.S. PATENT DOCUMENTS

| | | | | |
|---|---|---|---|---|
| 8,347,490 B1* | 1/2013 | Kuo | ...................... | H01F 5/003 |
| | | | | 336/200 |
| 8,803,648 B2* | 8/2014 | Lo | ...................... | H01F 27/2804 |
| | | | | 336/200 |
| 8,836,078 B2* | 9/2014 | Cho | .................... | H01L 23/5227 |
| | | | | 257/531 |
| 9,640,604 B2* | 5/2017 | Chen | ...................... | H01L 28/10 |
| 2007/0128821 A1* | 6/2007 | Lee | .................... | H01F 27/2804 |
| | | | | 438/381 |
| 2010/0225436 A1* | 9/2010 | Papavasiliou | ....... | H01F 17/0013 |
| | | | | 336/200 |
| 2011/0279214 A1* | 11/2011 | Lee | ...................... | H01F 19/04 |
| | | | | 336/220 |
| 2012/0146741 A1* | 6/2012 | Yen | .................... | H01L 23/5227 |
| | | | | 333/25 |
| 2012/0268229 A1 | 10/2012 | Yen et al. | | |
| 2013/0043554 A1* | 2/2013 | Piper | .................... | H01L 27/085 |
| | | | | 257/506 |
| 2014/0264734 A1* | 9/2014 | Luo | ...................... | H01L 23/147 |
| | | | | 257/531 |
| 2015/0097267 A1* | 4/2015 | Tseng | .................... | H01L 28/10 |
| | | | | 257/531 |

\* cited by examiner

INDUCTOR STRUCTURES FOR INTEGRATED CIRCUITS

RELATED APPLICATION

This application claims priority to U.S. Provisional Patent Application No. 61/970,797, entitled INDUCTOR STRUCTURES FOR INTEGRATED CIRCUITS, filed on Mar. 26, 2014, the contents of which are hereby incorporated by reference as if set forth in its entirety.

BACKGROUND

Inductors are used in many integrated circuits and other semiconductor devices and particularly in radio frequency (RF) circuits. It can be useful for the inductors to have high inductance values. This is difficult to achieve, however, on integrated circuits and other semiconductor devices because high inductance is achieved using larger inductors which are formed at the expense of other device features.

Inductors are used to form various transformer devices and an inductor is generally characterized as a coil of wires or a winding circuit. A transformer is generally formed of two or more such inductor coils. One inductor coil through which an electric current is flowing, can produce a magnetic field and a changing magnetic field within an inductor coil induces a voltage across the ends of the coil via electromagnetic induction. A transformer is a static electrical device that transfers energy by inductive coupling between its winding circuits. A varying current in the primary winding, i.e. inductor coil, creates a varying magnetic flux in the transformer's core and thus a varying magnetic flux through the secondary winding, i.e. inductor coil. The varying magnetic flux induces a varying electromotive force or voltage in the secondary inductor coil. When multiple inductor coils are used, multiple transformer devices are formed.

To improve the inductance of inductors, three-dimensional inductors were developed wherein the inductor is formed using a plurality of metal layers to form a helical shape. The portions of the metal from the different metal levels are interconnected to form an inductor. For a greater inductance to be achieved, however, a greater number of metal layers is used.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features may be arbitrarily expanded or reduced for clarity. Like numerals denote like features throughout the specification and drawing.

DETAILED DESCRIPTION

Various embodiments of the disclosure provide for inductor coils formed of two levels of metallization, and vias. Two or more inductor coils are formed intertwined with one another to form one or more transformer devices. Some embodiments of the disclosure provide for inductor coils formed of only two levels of metallization, and vias.

The inductor coils are formed of metal wires formed on two device levels. The metal wires formed on the two device levels are connected to one another through vias to form indictor coils. In some embodiments, each wire on a first device level is coupled to two metal wires on a second device level, and vice versa. In some embodiments, the two metal wires on the second device level form part of one inductor coil and the two metal wires are separated by a third metal wire of the second device level that forms part of a second inductor coil. In this embodiment, the third metal wire is coupled to two different metal wires of the first device level. In some embodiments, the two metal wires on the second device level are parallel one another. The inductor coils are vertically oriented and have magnetic axes that are parallel to the surface of the substrate upon which the inductor coils are formed.

Figure 1:
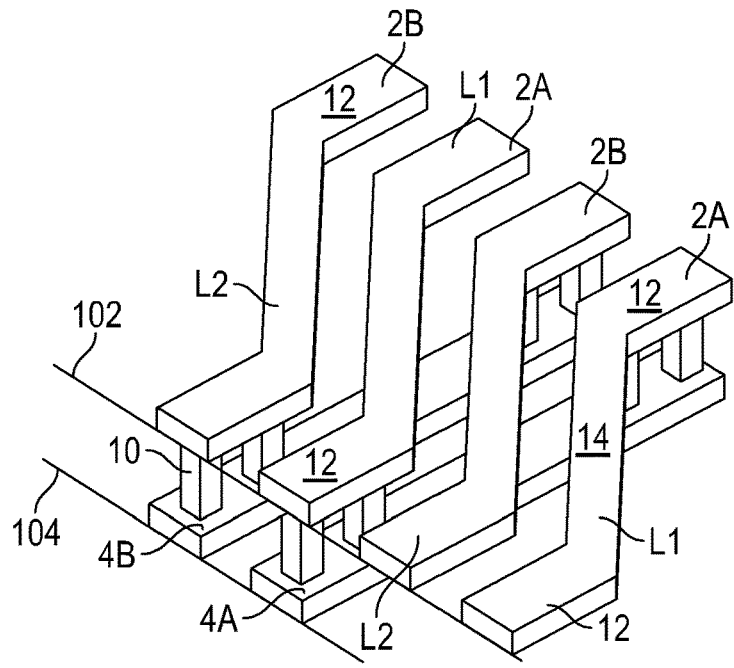
FIG. 1 is a perspective view of a portion of a two-inductor coil transformer according to various embodiments of the disclosure.

FIG. 1 shows a portion of a vertical inductor structure in perspective view, according to some embodiments of the disclosure. FIG. 1 shows portions of two inductors, L1, L2. Inductors L1, L2 are intertwined and form separate coils that are electrically isolated from one another by one or more dielectrics.

Each inductor L1, L2 is formed of metal wires from two wiring layers. Inductor L1 is formed of first level metal wires 2A formed on first device level 102, and second level metal wires 4A formed on second device level 104. First level metal wires 2A are coupled to second level metal wires 4A through vias 10. Inductor L2 is formed of first level metal wires 2B and second level metal wires 4B that are coupled to one another through vias 10. Second level metal wires 4A form part of inductor L1 (together with first level metal wires 2A) and second level metal wires 4B form part of inductor L2 together with first level metal wires 2A). In the illustrated embodiment, second level metal wires 4A, 4B are straight leads, parallel to one another, and disposed adjacent one another. In the illustrated embodiment, first level metal wires 2A, 2B are crooked wires, with each of their sections parallel to one another, and disposed adjacent one another. Angled segments 14 of first level metal wires 2A, 2B are parallel to one another and straight end segments 12 of first level metal wires 2A, 2B are also parallel to one another. Straight end segments 12 portions of first level metal wires 2A, 2B are directly over corresponding end portions of second level metal wires 4A, 4B in the illustrated embodiment.

In addition to FIG. 1, FIGS. 2-4 show in layout view different perspectives of the inductor coils shown in FIG. 1.

Figure 2:
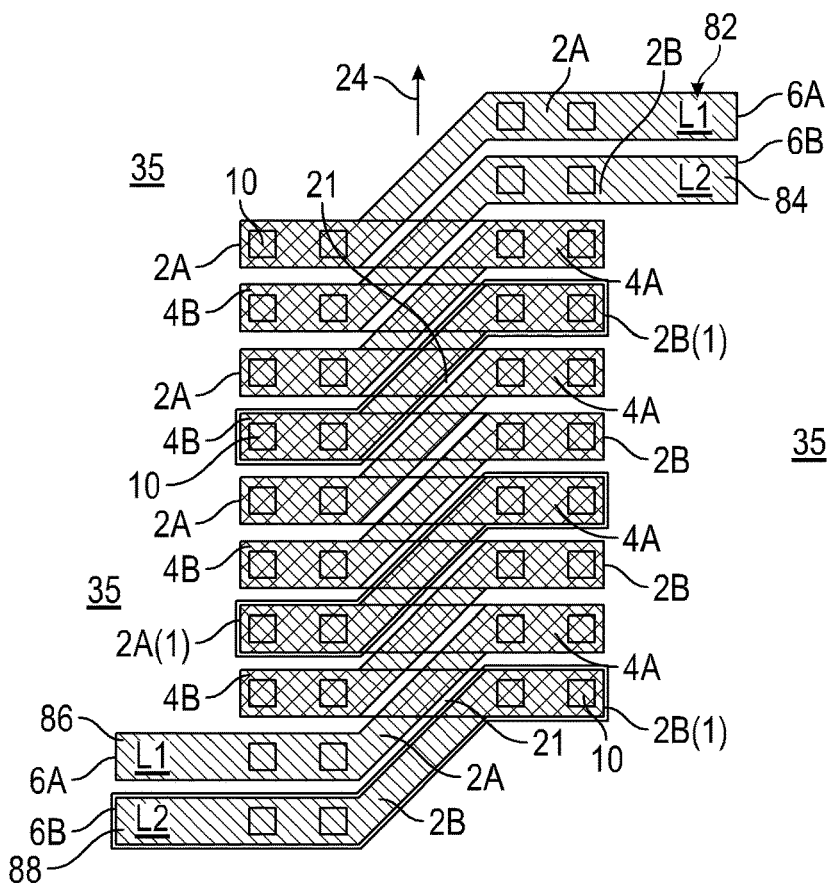
FIG. 2 is a plan view showing a layout of a two-inductor coil transformer, a portion of which was shown in FIG. 1.
Figure 2A:
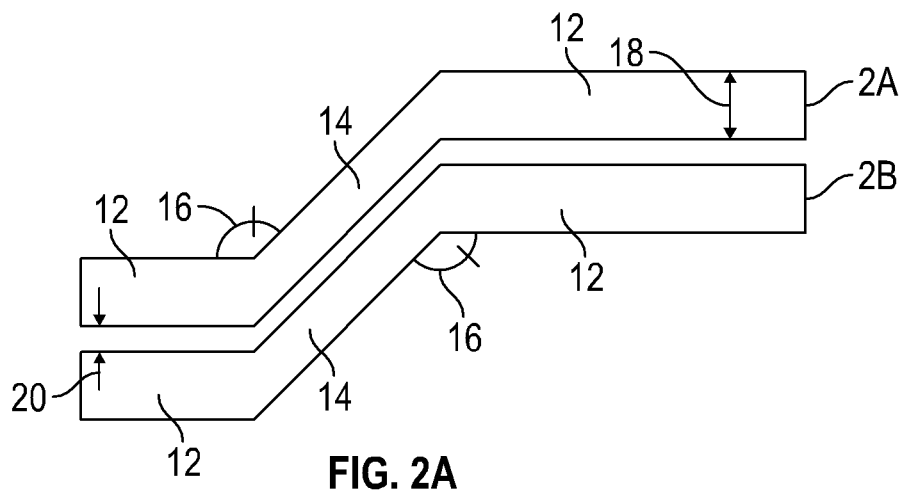
FIG. 2A is a plan view showing two metal wires of FIG. 2.

FIG. 2 is a plan view showing a layout of a two-inductor coil transformer, a portion of which was shown in FIG. 1. FIG. 2A is a plan view showing additional details of the two metal wires of FIG. 2.

In FIG. 2, angled or crooked first level metal wires 2A, 2B are positioned over and covering portions of the second level metal wires 4A, 4B. FIG. 2A shows straight end segment portions 12 of first level metal wires 2A, 2B. FIG. 2 shows that these straight end segments (labeled straight end segments 12 in FIG. 2A) are disposed directly over and therefore obscuring the corresponding end portions of second level metal wires 4A, 4B. Second level metal wires 4A, 4B are shown more clearly in FIG. 1, above. Again referring to FIG. 2, portions 21 are shaded differently to show that these portions 21 of second level metal wires 4A, 4B represent portions of second level metal wires 4A, 4B that are not covered by a portion of second level metal wires 2A, 2B. One first level metal wire 2A(1) is shown outlined by a dashed line for clarity and two first level metal wires 2B(1) are shown outlined by a dashed line for clarity.

Second level metal wires 4A, 4B are grouped such that every other second level metal wire is coupled together to form part of the same inductor coil. For example, every first level metal wire 4B, forms part of the same inductor coil L2. Similarly, every second level metal wire 4A, forms part of the same inductor coil L1. Adjacent ones of second level metal wires, i.e. second level metal wire 4A and adjacent second level metal wire 4B, form different inductor coils, i.e. second level metal wires 4A are part of inductor L1 and second level metal wires 4B are part of inductor L2. Each second metal wire 4A is coupled to two first level metal wires 2A and each second level metal wire 4B is coupled to two first level metal wires 2B. The metal wires 2A, 2B, 4A and 4B may alternatively be referred to as metal leads.

Two first level metal wires 2A, 2B are illustratively shown in FIG. 2A. In FIG. 2A, each first level metal wire 2A, 2B includes two parallel straight segments 12 coupled by angled segment 14. For each first level metal wire 2A, 2B, the two parallel straight end segments 12 are laterally offset from one another. Angle 16 may range from about 95° to about 175° in various embodiments, but various other angles are used in other embodiments to produce variations of the first level metal wires 2A, 2B shown in FIG. 2A. Width 18 of first level metal wires 2A, 2B is on the order of about 1-2 microns in some embodiments but other widths are used in other embodiments. Spacing 20 between adjacent first level metal wires 2A, 2B is on the order of about 1-2 microns in some embodiments but other spacings are used in other embodiments. In other embodiments, various other combinations are used to form the structure in FIG. 2A, of other structures in which straight end segments 12 of a metal wire are not linear but are offset from one another such as shown in FIG. 2A.

The configuration of first level metal wires 2A represents one embodiment that may be characterized as a zig-zag structure, and in other embodiments, first level metal wires 2A, 2B take on other configurations. In some embodiments, first level metal wires 2A, 2B are characterized as being zig-zag in shape. First level metal wires 2A, 2B are not straight lines but rather, have laterally offset portions in some embodiments. In some embodiments, the laterally offset portions are parallel straight segments 12. In some embodiments, first level metal wires 2A, 2B are straight lines angled with respect to second level metal wires 4A, 4B. In some embodiments, parallel straight end segments 12 are coupled by a feature other than angled segment 14, which is a straight feature that connects, but is angled with respect to, the two straight end segments 12. In some embodiments, two parallel straight segments 12 are coupled by a curved connector structure instead of straight angled segment 14 and in other embodiments, first level metal wires 2A, 2B take on other curvilinear shapes. First level metal wires 2A, 2B are designed in conjunction with second level metal wires 4A, 4B which are generally straight segments that are parallel to one another. In various embodiments, first level metal wires 2A are positioned with respect to second level metal wires 4A such that portions of each first level metal wire 2A are overlaid with portions of two laterally separated second level metal wires 4A. Similarly, in various embodiments, first level metal wires 2B are positioned with respect to second level metal wires 4B such that portions of each first level metal wire 2B are overlaid with portions of two laterally separated second level metal wires 4B.

In some embodiments (not illustrated), second level metal wires 4A, 4B are straight as illustrated, and first level metal wires 2A, 2B are also straight line segments angled with respect to second level metal wires 4A, 4B.

Again referring to FIGS. 1 and 2, each parallel straight segment 12 of first level metal wires 2A, 2B is overlaid with a corresponding portion of a second level metal wire 4A, 4B. In particular, each first level metal wire 2A has each of its two parallel straight segments 12 overlaid with a corresponding second level metal wire 4B. In particular, each first level metal wire 2A has two parallel straight segments 12 and the two parallel straight segments 12 are overlaid with and coupled to a different one of the second level metal wires 4A. The two second level metal wires 4A coupled to the same first level metal wire 2A and forming inductor coil L1 are separated by a second level metal wire 4B which is coupled to two first level metal wires 2B and which form inductor coil L2.

Each first level metal wire 2A is coupled to two second level metal wires 4A at each end by two vias 10. Each of the first level metal wires 2B is coupled to two second level metal wires 4B at each end by two vias 10. In other embodiments, more or less than two vias 10 are used at each straight segments 12 of first level metal wires 2A, 2B.

Although referred to herein as "first level metal wires 2A, 2B" and "second level metal wires 4A, 4B", in an embodiment, first level metal wires 2A, 2B represent a lower device level in a semiconductor device (with respect to second level metal wires 4A, 4B) and in another embodiment, first level metal wires 2A, 2B represent an upper metal level layer in the semiconductor device (with respect to second level metal wires 4A, 4B). In some embodiments, the two metal layers are consecutive metal layers, e.g. "metal 2" and "metal 3" and in other embodiments, the two metal level layers represent non-consecutive metal layers such as a metal 1 layer and a metal 5 layer, for example. First level metal wires 2A, 2B and second level metal wires 4A, 4B, represent two different metallization layers in a semiconductor device and either of the two may be the uppermost of the two metallization layers.

Figure 4:
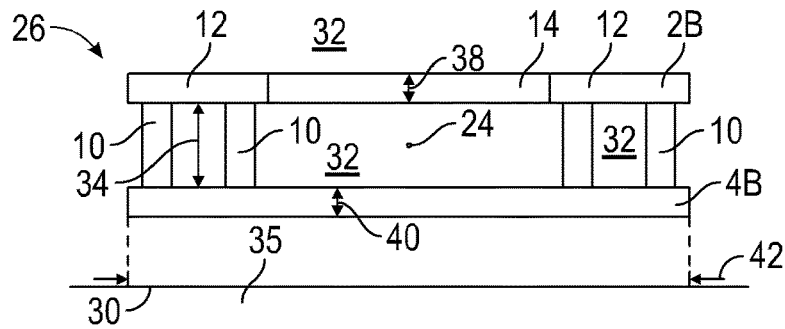
FIG. 4 is a side view looking along the direction of the magnetic flux of the segment of the two-inductor coil transformer shown in FIGS. 1 and 3.

FIG. 2 is a top view in which inductor coils L1, L2 formed over a substrate 35 (FIG. 4 shows inductor structures L1, L2 with respect to substrate surface 30 and substrate 35). In the orientation of FIG. 2, each of the inductor coils L1, L2 has a magnetic axis 24 that extends along the substrate surface, i.e. parallel to the substrate surface when operating.

The foregoing description of the contacts made by vias 10, between first level metal wires 2A, 2B, and second level metal wires 4A, 4B, applies to all of the illustrated first level metal wires 2A, 2B except the two uppermost and lowermost in the drawing of FIG. 2. The first level metal wires that appear as the uppermost and lowermost in the drawing are shown as not being coupled to a corresponding second level metal wire 4A, 4B at one of its parallel straight segments 12. Each of the two first level metal wires 2A, 2B that are shown uppermost in the drawing (also labeled 82, 84) and each of the first level metal wires 2A, 2B that are shown lowermost in the drawing (also labeled 86, 88) extends to corresponding contact portions 6A, 6B through which the inductor coils L1, L2 are coupled to outside components, respectively.

While the embodiment illustrated in FIG. 2 shows inductor coil L1 being formed of four second level metal wire 4A, in other embodiments, inductor coil L1 and inductor coil L2 are formed of different numbers of coils. In other embodiments, each of inductor coils L1 and L2 includes anywhere from about 10 to about 100 coils, i.e. about 10 to 100 second level metal wires.

Figure 3:
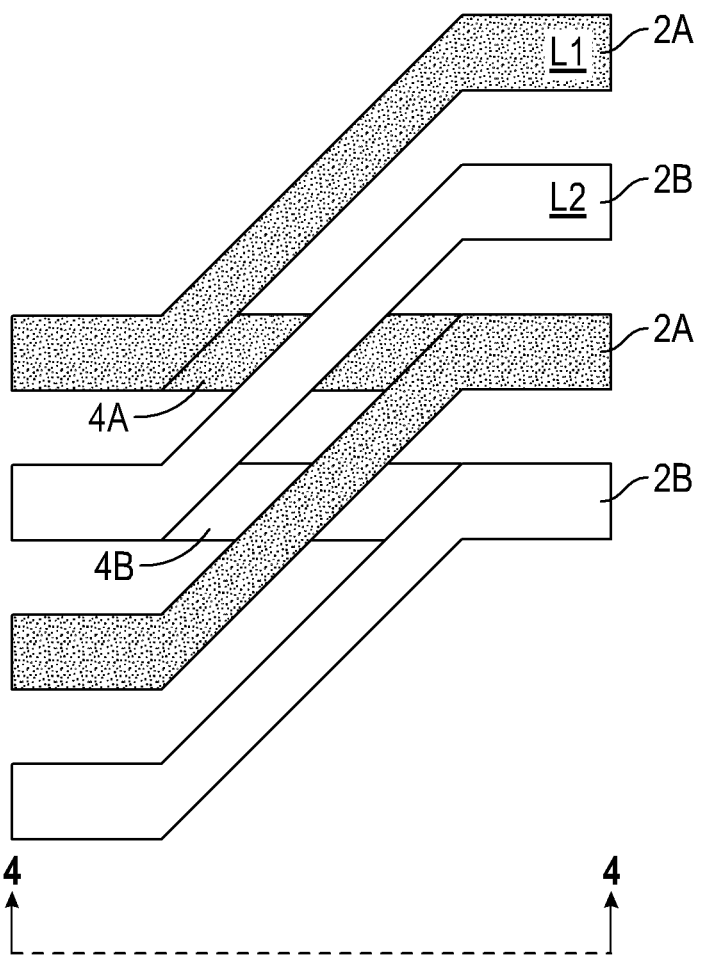
FIG. 3 is a top, plan view of the segment of a two-inductor coil transformer shown in FIG. 2.

FIG. 3 shows a top plan view of portions of two inductor coils L1, L2. Inductor coil L1 is formed from first level metal wires 2A and second level metal wires 4A and inductor L2 is formed of first level metal wires 2B and second level metal wires 4B. Inductor coils L1 and L2 are distinguished by their different shading.

FIG. 4 is a front view of a portion of a dual inductor coil transformer structure such as may be seen from line 4-4 of FIG. 3. The structure shown in FIG. 4 is formed over substrate surface 30 of substrate 35, and shows first level metal wires 2B disposed over second level metal wire 4B. The first and second level metal wires 2B, 4B represent any of various different metallization levels in various embodiments and are disposed over substrate surface 30 by various distances in various embodiments. The areas between first level metal wires 2A, 2B, second level metal wires 4A, 4B and vias 10 are filled with dielectric 32. Various suitable dielectrics are available and various different dielectrics are used in various embodiments. In some embodiments, low-k dielectrics are used as dielectric 32, in some embodiments silicon dioxide, silicon oxynitride or various other suitable dielectrics are used. First level metal wires 2A, 2B and second level metal wires 4A, 4B are formed of various suitable metals in various embodiments. In some embodiments, at least one of first level metal wires 2A, 2B and second level metal wires 4A, 4B is formed of aluminum, copper, alloys thereof or various other suitable conductive materials.

Height 34 of vias 10 varies in various embodiments. This is due to the spacing between first level metal wires 2A, 2B and second level metal wires 4A, 4B. In some embodiments, height 34 varies from about 8,000 angstroms to about 12,000 angstroms but various other thicknesses are used in other embodiments. In some embodiments in which the integrated circuit or other semiconductor device includes multiple layers of metallization and in which first level metal wires 2A, 2B and second level metal wires 4A, 4B are not horizontally adjacent metal levels, the spacing between the metal layers and therefore the height of vias 10 is greater than 12000 angstroms. Each of thickness 38 of first level metal wires 2A, 2B and thickness 40 of second level metal wires 4A, 4B lies in the range of about 3-5,000 angstroms in some embodiments but various other thicknesses are used in other embodiments. Length 42 of second level metal wire 4B is about 30.000 angstroms in an embodiment. In other embodiments, length 42 is greater than 30,000 angstroms and in still other embodiments, length 42 takes on various other values. Magnetic axis 24 is indicated by the point indicating the direction of the magnetic axis 24 into and out of the plane of the drawing figure and is produced by electrical current traveling clockwise or counterclockwise through the conductive features shown in FIG. 4. When current flows through one inductor coil L1, energy is transferred by inductive coupling to the other inductor coil L2. In this manner, a transformer device is formed.

Figure 5:
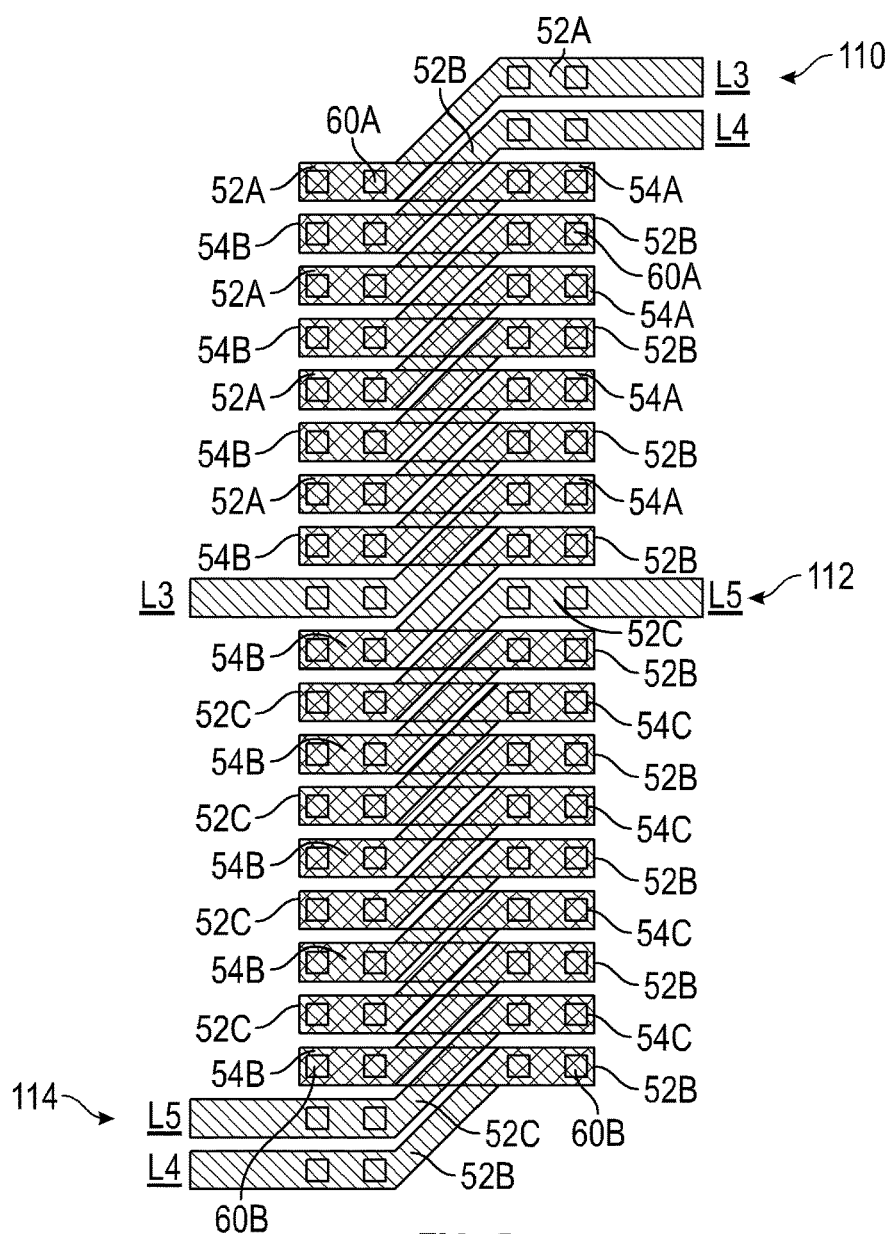
FIG. 5 is a plan view showing a layout of a three-inductor coil transformer according to various other embodiments of the disclosure.

FIG. 5 shows an embodiment with three inductor coils intertwined. In other embodiments, more inductor coils are formed and intertwined. In FIG. 2, two inductor coils L1, L2 extended throughout the length of the two inductor coil-transformer. In FIG. 5, instead of two inductor coils extending the length of the illustrated transformer, there are 3 inductor coils, primary inductor coil L4 and inductor coil L3 and L5. Inductor coil L4 is designated the primary inductor coil because it is the longest inductor coil and extends the length of the illustrated transformer. Inductor coil L3 extends from location 110 to location 112, and inductor coil L5 extends from location 112 to location 114. Inductor coils L4 and L3 extend between locations 110 and 112 and inductor coils L4 and L5 extend between locations 112 and 114. When current flows through the primary inductor coil L4, energy is transferred by inductive coupling to both inductor coil L3 and inductor coil L5. In this manner, multiple transformer devices are formed.

The transformers of FIG. 5 include first level metal wires 52A, 52B, 52C and second level metal wires 54A, 54B, 54C. Inductor L3 is formed of first level metal wires 52A coupled to second level metal wires 54A through vias 60A. Inductor L4 is formed of first level metal wires 52B coupled through vias 60A and 60B to second level metal wires 54B and inductor L5 is formed of first level metal wires 52C coupled to second level metal wires 54C through vias 60B. First level metal wires 52A-C are similar to first level metal wires 2A, 2B of FIG. 2 and second level metal wires 54A-C are similar to second level metal wires 4A, 4B shown and described in conjunction with FIG. 2. In other embodiments (not shown), inductor L4 forms longer coil and is intertwined with and inductively coupled to additional inductor coils in addition to inductor coils L3 and L5.

In an embodiment, the disclosure provides a device comprising: a transformer on a semiconductor device including a plurality of inductor coils, each inductor coil comprising: a plurality of first level metal wires coupled to a plurality of second level metal wires through vias, the second level metal wires being straight and parallel to one another, and each of the plurality of the first level metal wires including a duality of segments laterally offset from one another and coupled by a further segment.

In some embodiments, each first level metal wire includes a first segment of the duality of segments overlaid with and coupled to a first wire of the second level metal wires, and a second segment of the duality of segments parallel to the first segment and overlaid with and coupled to a second wire of the second level metal wires, the first and second wires spaced apart by at least a third wire of the second level metal wires.

In some embodiments, the duality of segments are parallel one another, the further segment is a straight segment angled with respect to the parallel segments and the parallel segments are further parallel to the second level metal wires.

In some embodiments, the first level metal wires are formed of a lower metal level of the semiconductor device and the second level metal wires are formed of an upper metal level of the semiconductor device.

In some embodiments, the first level metal wires are formed of an upper metal level of the semiconductor device and the second level metal wires are formed of a lower metal level of the semiconductor device.

In some embodiments, each segment of the duality of segments is coupled to one of the second level metal wires by at least two vias.

In some embodiments, each first level metal wire is coupled to two wires of the second level metal wires, the two wires spaced apart by at least a third wire of the second level metal wires.

In another embodiment, an inductor structure on a semiconductor device is provided. The inductor structure comprises: a plurality of first level metal wires; a plurality of second level metal wires, each including a duality of parallel segments coupled by a further segment; each second level metal wire including a first parallel segment of the duality of parallel segments coupled to a first wire of the first level metal wires overlaid with the first segment, and a second parallel segment of the duality of parallel segments coupled to a second wire of the first level metal wires overlaid with the second segment, the first and second wires spaced apart by at least a third wire of the second level metal wires; and wherein the plurality of first level metal wires are coupled to the plurality of second metal wires to form a duality of coils in which adjacent ones of the first level metal wires form parts of different coils of the duality of coils.

In some embodiments, adjacent ones of the second level metal wires form parts of different coils of the duality of coils.

In some embodiments, the first level metal wires of the plurality of first level metal wires are straight and parallel one another.

In some embodiments, the further segment is an angled straight segment that forms an angle of about 135° with each of the duality of parallel segments.

In some embodiments, for each second level metal wire, the first segment is coupled to the first wire by a duality of vias and the second segment is coupled to the second wire by a duality of vias and the vias include a height of about 8 k angstroms to about 12 k angstroms.

In some embodiments, the first level metal wires are straight, parallel to one another, and formed of an upper metal level of the semiconductor device and the second level metal wires are formed of a lower metal level of the semiconductor device.

In some embodiments, the first level metal wires are straight, parallel to one another, and formed of a lower metal level of the semiconductor device and the second level metal wires are formed of an upper metal level of the semiconductor device.

In some embodiments, the first level metal wires and the second level metal wires each have an average width of about 1-2 microns.

In another embodiment, transformer device on a semiconductor device, is provided. The transformer device comprises a plurality of inductor coils formed of a plurality of first level metal wires coupled to a plurality of second level metal wires, each of the first level metal wires being substantially straight and each of the plurality of second metal wires coupled to two of the plurality of first metal wires that are separated by at least a third one of the plurality of second metal wires.

In some embodiments, the plurality of first metal wires are parallel one another, the plurality of second metal wires are parallel one another and include a zig-zag structure, and each of the plurality of first metal wires is coupled to two of the plurality of second metal wires.

In some embodiments, the first metal wires are adjacent one another and immediately adjacent ones of the first level metal wires are coupled to different inductor coils of the plurality of inductor coils in a first group of the first level metal wires.

In some embodiments, the plurality of inductor coils includes three inductor coils, the first level metal wires are adjacent one another and, in a first group of the first level metal wires, immediately adjacent ones of the first level metal wires are coupled to a first coil and a second coil, respectively, and in a second group of the first level metal wires, immediately adjacent ones of the first level metal wires are coupled to the second coil and a third coil, respectively.

In some embodiments, the first metal wires are adjacent one another and arranged in a numerical sequence whereby the odd-numbered ones of the first level metal wires form a first inductor coil and even-numbered ones of the first level metal wires form a second inductor coil, and each of the second level metal wires includes a duality of parallel segments coupled by an angled segment therebetween.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A device comprising:
   a transformer on a semiconductor device including first, second, and third inductor coils, each said inductor coil comprising:
   a plurality of first level metal wires along a first level coupled to a plurality of second level metal wires along a second level through vias, the first level separated from the second level,
   said second level metal wires being parallel to one another, and said plurality of said first level metal wires including:
a first zig-zag segment and a second zig-zag segment laterally spaced from one another with a third zig-zag segment, and
a fourth zig-zag segment and a fifth zig-zag segment laterally spaced from one another with a sixth zig-zag segment,
wherein the first, second, fourth, and fifth zig-zag segments belong to the first inductor coil, the third zig-zag segment belongs to the second inductor coil, and the sixth zig-zag segment belongs to the third inductor coil, and
wherein each of the first, second, third, fourth, fifth, and sixth zig-zag segments comprises first and second parallel sub-segments coupled by a third intermediate sub-segment that is angled from the first and second parallel sub-segments, and at least one of the parallel first and second sub-segments of the first inductor coil includes an elongated sub-segment along the first level extending beyond other parallel sub-segments of the first inductor coil so as to facilitate coupling between the elongated sub-segment and a contact, wherein the elongated sub-segment is continuous along the first level with the at least one of the parallel first and second sub-segments.

2. The device as in claim 1, wherein said first zig-zag segment is overlaid with and coupled to a first wire of said second level metal wires, the second zig-zag segment is parallel to said first segment and overlaid with and coupled to a second wire of said second level metal wires, said first and second wires that belong to the first inductor coil are spaced apart by at least a third wire of said second level metal wires that belongs to the second inductor coil, said fourth zig-zag segment is overlaid with and coupled to a third wire of said second level metal wires, the fifth zig-zag segment is parallel to said fourth zig-zag segment and overlaid with and coupled to a fourth wire of said second level metal wires, said third and fourth wires that belong to the first inductor coil are spaced apart by at least a fifth wire of said second level metal wires that belongs to the third inductor coil and said second level metal wires are straight.

3. The device as in claim 1, wherein said second level metal wires are straight, said first, second, third, fourth, fifth, and sixth zig-zag segments are parallel to one another.

4. The device as in claim 3, wherein each of said first, second, third, fourth, fifth, and sixth zig-zag segments is coupled to one of said second level metal wires by at least two vias.

5. The device as in claim 1, wherein said first level metal wires are formed of a lower metal level of said semiconductor device and said second level metal wires are formed of an upper metal level of said semiconductor device.

6. The device as in claim 1, wherein said first level metal wires are formed of an upper metal level of said semiconductor device and said second level metal wires are formed of a lower metal level of said semiconductor device.

7. The device as in claim 1, wherein each said first level metal wire is coupled to two wires of said second level metal wires, said two wires spaced apart by at least a third wire of said second level metal wires.

8. An inductor structure on a semiconductor device comprising:
a plurality of first level metal wires along a first level;
a plurality of second level metal wires along a second level, each including a duality of parallel segments coupled by a further segment angled from the duality of parallel segments;
each said second level metal wire including a first parallel segment of said duality of parallel segments coupled to a first wire of said first level metal wires overlaid with said first segment, and a second parallel segment of said duality of parallel segments coupled to a second wire of said first level metal wires overlaid with said second segment, said first and second wires spaced apart by at least a third wire of said second level metal wires;
wherein said plurality of first level metal wires are coupled to said plurality of second metal wires to form first and second coils in which adjacent ones of said first level metal wires form parts of different coils of said first and second coils,
wherein at least one of the parallel segments of the first coil includes an elongated segment extending beyond other parallel segments of the first coil along the second level so as to facilitate coupling between the elongated segment and a contact, and
wherein the elongated segment is continuous along the first level with the least one of the parallel segments of the first coil.

9. The inductor structure as in claim 8, wherein adjacent ones of said second level metal wires form parts of different coils of said duality of coils.

10. The inductor structure as in claim 8, wherein said first level metal wires of said plurality of first level metal wires are straight and parallel one another.

11. The inductor structure as in claim 8, wherein said further segment is an angled straight segment that forms an angle of about 135° with each of said duality of parallel segments.

12. The inductor structure as in claim 8, wherein, for each said second level metal wire, said first segment is coupled to said first wire by a duality of vias and said second segment is coupled to said second wire by a duality of vias.

13. The inductor structure as in claim 12, wherein said first level metal wires are straight, parallel to one another, and formed of an upper metal level of said semiconductor device, said second level metal wires are formed of a lower metal level of said semiconductor device, said vias include a height of about 8 k angstroms to about 12 k angstroms and said first level metal wires and said second level metal wires each have an average width of about 1-2 microns.

14. The inductor structure as in claim 8, wherein said first level metal wires are straight, parallel to one another, and formed of a lower metal level of said semiconductor device and said second level metal wires are formed of an upper metal level of said semiconductor device.

15. A transformer device on a semiconductor device comprising:
first, second, and third inductor coils formed of a plurality of first level metal wires along a first level coupled to a plurality of second level metal wires along a second level,
wherein said first inductor coil comprises first and second subsets of segments of said second level metal wires,
wherein said second inductor coil comprises at least one first segment of said second level metal wires, at least two of said first subset of segments of said first inductor coil are parallel and separated by said at least one first segment of said second inductor coil,
wherein said third inductor coil comprises at least one second segment of said second level metal wires, at least two of said second subset of segments of said first inductor coil are parallel and separated by said at least one second segment of said third inductor coil, wherein each of the first and second subsets of segments of said first inductor coil comprises first and second parallel sub-segments coupled by a third intermediate sub-segment that is angled from the first and second parallel sub-segments along the second level, and at least one of the first and second parallel sub-segments of the first inductor coil includes an elongated sub-segment along the second level extending beyond other parallel sub-segments of the first inductor coil so as to facilitate coupling between the elongated sub-segment and a contact, wherein the elongated sub-segment is continuous along the first level with the at least one of the first and second parallel sub-segments, and wherein each of said first level metal wires are substantially straight.

16. The transformer device as in claim 15, wherein said plurality of first metal wires are parallel one another, said plurality of second metal wires are parallel one another and include a zig-zag structure, and each of said plurality of first metal wires is coupled to two of said plurality of second metal wires.

17. The transformer device as in claim 15, wherein said first metal wires are adjacent one another and immediately adjacent ones of said first level metal wires are coupled to different inductor coils of said plurality of inductor coils in a first group of said first level metal wires.

18. The transformer device as in claim 15, wherein said first metal wires are adjacent one another and arranged in a numerical sequence whereby odd-numbered ones of said first level metal wires form a first inductor coil and even-numbered ones of said first level metal wires form a second inductor coil.

19. The transformer device as in claim 18, wherein each of said second level metal wires includes a duality of parallel segments coupled by an angled segment therebetween.

* * * * *